United States Patent
Yamashita et al.

(10) Patent No.: US 12,115,755 B2
(45) Date of Patent: Oct. 15, 2024

(54) LAMINATE OF POLYIMIDE FILM AND INORGANIC SUBSTRATE

(71) Applicant: TOYOBO CO., LTD., Osaka (JP)

(72) Inventors: Masahiro Yamashita, Otsu (JP); Tetsuo Okuyama, Otsu (JP); Toshiyuki Tsuchiya, Otsu (JP); Naoki Watanabe, Otsu (JP); Kaya Tokuda, Otsu (JP); Shota Hara, Otsu (JP)

(73) Assignee: TOYOBO CO., LTD., Osaka (JP)

( * ) Notice: Subject to any disclaimer, the term of this patent is extended or adjusted under 35 U.S.C. 154(b) by 873 days.

(21) Appl. No.: 16/617,444

(22) PCT Filed: May 24, 2018

(86) PCT No.: PCT/JP2018/020016
§ 371 (c)(1),
(2) Date: Nov. 26, 2019

(87) PCT Pub. No.: WO2018/221374
PCT Pub. Date: Dec. 6, 2018

(65) Prior Publication Data
US 2021/0122143 A1    Apr. 29, 2021

(30) Foreign Application Priority Data

May 29, 2017 (JP) ................................ 2017-105414
May 29, 2017 (JP) ................................ 2017-105417

(51) Int. Cl.
*B32B 27/16* (2006.01)
*B32B 17/10* (2006.01)
(Continued)

(52) U.S. Cl.
CPC .............. *B32B 17/10* (2013.01); *B32B 27/16* (2013.01); *B32B 27/281* (2013.01);
(Continued)

(58) Field of Classification Search
CPC .............. B32B 2250/02; B32B 27/281; B32B 37/0007; B32B 3/28
See application file for complete search history.

(56) References Cited

U.S. PATENT DOCUMENTS

2002/0027294 A1* 3/2002 Neuhaus .............. H05K 3/4007
257/737
2005/0118939 A1* 6/2005 Duescher ............... B24D 18/00
451/527

(Continued)

FOREIGN PATENT DOCUMENTS

CN          104769021 A      7/2015
JP          2010-283262 A    12/2010
(Continued)

OTHER PUBLICATIONS

China National Intellectual Property Administration, The First Office Action in Chinese Patent Application No. 201880035479.9 (Nov. 12, 2020).

(Continued)

*Primary Examiner* — Alicia J Weydemeyer
(74) *Attorney, Agent, or Firm* — Leydig, Voit & Mayer, Ltd.

(57) ABSTRACT

The invention provides a laminate including a polyimide film and an inorganic substrate, which has a number density of blisters including carbide particles therein of $50/m^2$ or less, an average height of blisters of 2 μm or less, a product of the number density of the blisters (blisters/$m^2$) and the average height of the blisters (μm) of 20 or less. The inventive laminate can be obtained by laminating the polyimide film and the inorganic substrate after sufficiently purifying and cleaning to remove foreign bodies made of inorganic substance therefrom, followed by heat treating the laminate at a temperature of 350-600° C. and then rapidly cooling it to carbonize and reduce the organic foreign (Continued)

bodies, and also to rapidly cool the gas contained in the blisters, which leads to reduced height of blisters.

10 Claims, 1 Drawing Sheet

(51) Int. Cl.
  *B32B 27/28* (2006.01)
  *B32B 38/00* (2006.01)
  *B32B 38/10* (2006.01)
(52) U.S. Cl.
  CPC .......... *B32B 38/0036* (2013.01); *B32B 38/10* (2013.01); *B32B 2250/02* (2013.01); *B32B 2250/03* (2013.01); *B32B 2255/24* (2013.01); *B32B 2255/26* (2013.01); *B32B 2307/50* (2013.01); *B32B 2307/732* (2013.01); *B32B 2309/02* (2013.01); *B32B 2310/0409* (2013.01); *B32B 2379/08* (2013.01); *B32B 2457/206* (2013.01)

(56) References Cited

U.S. PATENT DOCUMENTS

| | | |
|---|---|---|
| 2010/0068483 A1 | 3/2010 | Leu et al. |
| 2010/0143708 A1 | 6/2010 | Liao et al. |
| 2012/0201961 A1 | 8/2012 | Liao et al. |
| 2016/0046101 A1* | 2/2016 | Ueda .................. B29C 37/0025 206/459.5 |
| 2017/0225433 A1 | 8/2017 | Okuyama et al. |

FOREIGN PATENT DOCUMENTS

| | | | |
|---|---|---|---|
| JP | 2011-011455 A | 1/2011 | |
| JP | 4834758 A | 12/2011 | |
| JP | 2013-010342 A | 1/2013 | |
| JP | 2015202675 A * | 11/2015 | |
| JP | 2015214053 A * | 12/2015 | |
| JP | 2016-120629 A | 7/2016 | |
| JP | 2016-120630 A | 7/2016 | |
| WO | WO-2012050072 A1 * | 4/2012 | ......... B32B 38/0008 |
| WO | WO-2013114685 A1 * | 8/2013 | ............ B32B 27/06 |
| WO | WO 2016/031746 A1 | 3/2016 | |

OTHER PUBLICATIONS

Japanese Patent Office, International Search Report in PCT Patent Application No. PCT/JP2018/020016 (Jul. 24, 2018).

* cited by examiner

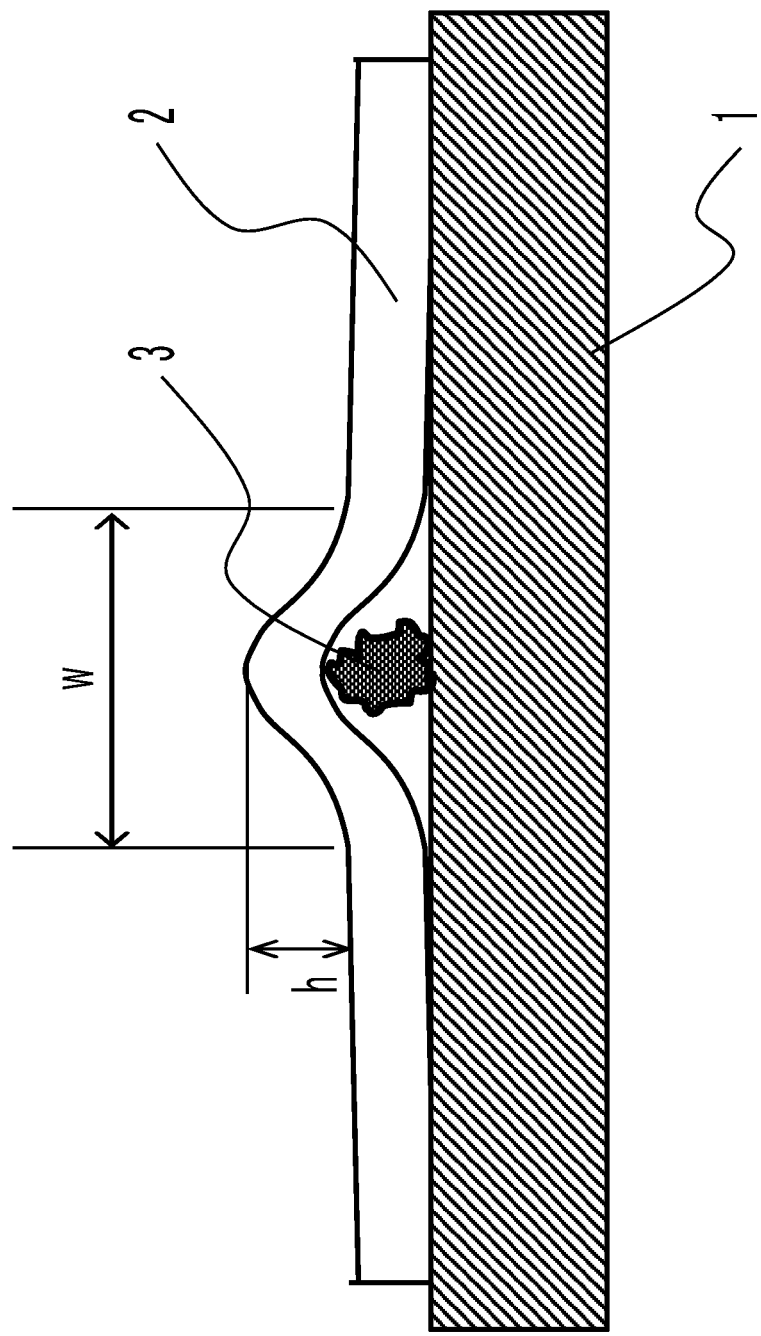

LAMINATE OF POLYIMIDE FILM AND INORGANIC SUBSTRATE

CROSS-REFERENCE TO RELATED APPLICATIONS

This patent application is the U.S. national phase of International Patent Application No. PCT/JP2018/020016, filed May 24, 2018, which claims the benefit of Japanese Patent Application No. 2017-105417, filed May 29, 2017, and Japanese Patent Application No. 2017-105414, filed May 29, 2017, which are incorporated by reference in their entireties herein.

TECHNICAL FIELD

The present invention relates to a laminate including a polyimide film and an inorganic substrate such as glass, and more specifically relates to a laminate including a polyimide film and an inorganic substrate, for use in producing a flexible functional element including the polyimide firm as a substrate by laminating a polyimide film on an inorganic substrate to temporarily support a flexible polyimide film, fabricating a functional element such as an electronic device on the polyimide film, and then separating the polyimide film from the inorganic substrate, thereby producing a flexible functional element including the polyimide film as a substrate.

BACKGROUND ART

In recent years, for the purpose of weight reduction, size and thickness reduction, and flexibility improvement in functional elements such as semiconductor devices, MEMS elements, display elements, and wearable sensors, techniques for forming these elements on a polymer film have been actively developed. That is, as a material for the substrate of an electronic component such as an information communication apparatus (broadcasting apparatus, mobile radio, portable communication apparatus, etc.), a radar, or a high-speed information processor, conventionally, ceramics having heat resistance and also capable of adapting to an increase in the signal band frequency (reaching the GHz band) of an information communication apparatus have been used. However, ceramics are not flexible and are also difficult to make thinner, and thus have a disadvantage in that the applicable field is limited. Therefore, recently, polymer films have been used as substrates.

In the formation of a functional element on the surface of a polymer film, it is considered ideal to perform processing through a roll-to-roll process, which utilizes the characteristic flexibility of a polymer film. However, in the semiconductor industry, the MEMS industry, the display industry, and the like, a process technology intended for rigid plane substrates, such as wafer bases or glass substrate bases, has been established in the past. Thus, in order to form a functional element on a polymer film utilizing the existing infrastructure, a process in which a polymer film is attached to a rigid support made of an inorganic substance, such as a glass plate, a ceramic plate, a silicon wafer, or a metal plate, for example, and a desired element is formed thereon and then separated from the support, is used.

Meanwhile, when a conducting material, an insulating material, a semiconducting material, or the like for use in a functional element is formed into the shape of a polymer film, a vacuum thin-film method, a thick-film method, or the like is used, and the material is often heated during the formation process. Generally, these materials develop better characteristics when a high-temperature process is used. Therefore, heat resistance is required in the state where a polymer film is attached to a support made of an inorganic substance. However, in many cases, in the case where the polymer film is attached to the support using an adhesive material, the process is adversely affected due to the low heat resistance of the adhesive material.

Since not many heat-resistant bonding means for attaching a polymer film to an inorganic substrate are available, for such an application, a technology in which a polymer solution or a polymer precursor solution is applied onto an inorganic substrate, dried/cured on a support and formed into a film is known. Further, in order to facilitate separation, a technology of forming a plurality of layers and using some of them as sacrifice layers, or a technology of separating the functions into the bonding/separation function and the film physical properties, for example, has been proposed (Patent Documents 1 to 3).

A polymer film obtained by such a means is fragile and easily tears. Therefore, it often happens that the functional element formed on the polymer film surface fractures upon separation from the support. In particular, it is extremely difficult to separate a large-area film from the support, and a yield industrially acceptable cannot be obtained. Under such circumstances, as a laminate including a polymer film and a support for forming a functional element, a laminate obtained by attaching a polyimide film, which has excellent heat resistance, is tough, and can be formed as a thin film, to a support made of an inorganic substance (inorganic layer) through a silane coupling agent has been proposed (Patent Documents 4 to 5).

In reality, various defects are present on the polymer film surface of such a laminate, causing a decrease in the yield of functional element production. In the case where the polymer film itself has defects such as cracks, the quality of the polymer film has to be improved. In the case where the polymer film has foreign bodies adhering to the surface thereof, such a defect can be dealt with by cleaning the polymer film surface at the same time with the process cleaning. However, even when a high-quality polymer film is used, and further cleaning is performed, it often happens that defects still remain on the polymer film surface, and the yield of functional element production is not enhanced.

RELATED ART DOCUMENTS

Patent Documents

Patent Document 1: Japanese Unexamined Patent Publication No. 2016-120629
Patent Document 2: Japanese Unexamined Patent Publication No. 2016-120630
Patent Document 3: Japanese Patent No. 4834758
Patent Document 4: Japanese Unexamined Patent Publication No. 2010-283262
Patent Document 5: Japanese Unexamined Patent Publication No. 2011-11455

SUMMARY OF THE INVENTION

Problems to be Solved by the Invention

The present inventors have conducted extensive research to improve the production yield. As a result, they have found that the decreased yield of functional element production is partly attributable to blisters. During the attachment of a polymer film to a rigid inorganic substrate having a smooth surface (hereinafter, the case of using a glass plate as a typical example of an inorganic substrate will be mainly described), in the case where foreign bodies are caught between the polymer film and the glass plate, a part of the polymer film bulges from the glass plate like a tent with such a foreign body serving as the pole, whereby a void is created between the polymer film and the glass plate, resulting in a defect that the film surface becomes convex. Defects of this type are blister defects (sometimes also simply refers to as blisters, or bubbles, floats, or air bubbles).

In the case where a polymer film and an inorganic substrate are attached through a relatively thick adhesive layer, foreign bodies are buried in the adhesive layer, and thus blisters are relatively unlikely to be generated. However, in the case where the adhesive layer is thin, particularly in the case where the height of foreign bodies is greater than the adhesive layer, blisters are generated.

According to the present inventors, the reduction of blisters has been achieved by cleaning (washing) the polymer film and glass plate (inorganic substrate) surfaces before attachment. However, even with careful washing, the eradication of blister generation has not yet been achieved.

Means for Solving the Problems

The present inventors conducted extensive research to solve the above problems. As a result, in a laminate including a polymer film and a support made of an inorganic substance thereon, they have found a formulation according to which even in the case where the adhesive layer is thin, or substantially no adhesive layer is present, the generation of blisters can be suppressed, and a high production yield can be achieved, and thus accomplished the present invention.

The present invention is as follows:

[1] A laminate comprising a polyimide film and an inorganic substrate, characterized in that the laminate satisfies at least one of the following condition (a) or (b):
  (a) a number density of blisters is 50/m$^2$ or less, an average height of blisters is 2 µm or less, and a product of the number density of blisters (blisters/m$^2$) and the average height of blisters (µm) is 20 or less;
  (b) a number density of blisters having a height of 3 µm or more is 10/m$^2$.

[2] The laminate comprising a polyimide film and an inorganic substrate according to [1], wherein the laminate has an area of 0.157 m$^2$ or more.

[3] The laminate comprising a polyimide film and an inorganic substrate according to [1] or [2], wherein carbide particles are contained inside the blisters.

[4] The laminate comprising a polyimide film and an inorganic substrate according to any one of [1] to [3], further comprising a silane coupling agent condensate layer having a thickness of 5 nm to 500 nm between the polyimide film and the inorganic substrate.

[5] A method for producing the laminate comprising a polyimide film and an inorganic substrate according to any one of [1] to [4], the method comprising the steps in the sequence set forth:
  laminating a polyimide film and an inorganic substrate;
  subjecting the resulting laminate to a heat treatment at a temperature of 350° C. or more and less than 600° C.

[6] The method for producing the laminate comprising a polyimide film and an inorganic substrate according to [5], further comprising, after the heat treatment, cooling the laminate at a rate of 10° C./min or more and 90° C./min or less to at least 200° C.

[7] The method for producing the laminate comprising a polyimide film and an inorganic substrate according to [5] or [6], further comprising, as a pre-process before laminating a polyimide film and an inorganic substrate, washing the polyimide film with ultrapure water pretreated with ozone.

The present invention preferably further comprises the following feature.

[8] The method for producing the laminate comprising a polyimide film and an inorganic substrate according to any one of [5] to [7], further comprising, as the above cooling treatment, cooling the laminate by bringing the inorganic substrate side of the laminate into contact with a metal plate the temperature of which is 180° C. or less.

Effects of the Invention

There are a wide variety of foreign bodies that cause blisters. The foreign bodies include inorganic or organic substances present in the environment, and adhere to a film or an inorganic substrate due to static electricity or the like. Generally, inorganic substances can be removed relatively easily by washing or the like. Among organic foreign bodies adhering to the surface of a polyimide film, a characteristic substance is polyimide particles. Such polyimide particles are estimated to be generated during the polyimide film production step or slit step, for example. Such foreign bodies from polyimides can be removed relatively easily by washing or the like as in the case of inorganic substances.

However, organic foreign bodies of adhesive or environment origin, foreign bodies of biological origin, and the like are relatively flexible and also have stickiness in some cases. Accordingly, it is difficult to completely remove them through a simple washing treatment. Meanwhile, it is believed that such organic substances having flexibility and stickiness have lower heat resistance as compared with polyimide films and inorganic substrates used in the present invention, and can be removed by thermal decomposition in a high-temperature pretreatment.

However, the provision of such a pretreatment in the actual process causes an increase in the production time from heating to cooling and also has a high risk of the adhesion of new foreign bodies or the generation of cracks accompanying handling, for example, and thus is not realistic.

The present invention is characterized in that after a film and an inorganic substrate are attached, a heat treatment is performed under predetermined conditions; as a result, even in the case where organic foreign bodies are present between the film and the inorganic substrate, the height of blisters is reduced and improved to a level that causes no practical problem. That is, the effect of the present invention is that even when there are blisters internally containing foreign bodies, in the case where the internal foreign bodies are carbides, the height of blisters is low, and a decrease in the yield can be minimized. In addition, the effect is also in that organic foreign body-containing blisters having a problematic height can be converted into carbide foreign body-containing blisters by a specific treatment method, and the height of blisters can be reduced to a non-problematic level.

In the present invention, in particular, the effect of the present invention can be made further remarkable by controlling the cooling rate after the heat treatment within a predetermined range. That is, as a result of cooling at a specific rate, blisters swollen with gas from decomposition of organic substances can be quickly contracted. In the case where the cooling rate is unnecessarily slow, it may happen that before the blisters are sufficiently contracted, the elastic modulus of the polyimide film that has decreased due to the high temperature returns to the original value, and the shape retentively of the polyimide film itself increases, making it impossible to sufficiently reduce the height of the blisters.

A large-size of the substrate often causes unevenness of the heating rate and the cooling rate. In the present invention, it is particularly important to reduce unevenness in the cooling rate. Therefore, in the present invention, the laminate is preferably cooled by direct contact with a substance having high specific heat such as a metal plate, for example.

In addition, in the present invention, as a still more preferred mode, a polyimide film before lamination is washed with ultrapure water pretreated with ozone, whereby a sufficient effect can be obtained. That is, the cause of blisters is gas from decomposition of organic foreign bodies. When the polyimide surface is washed with ultrapure water from which organic substances have been previously decomposed and removed by an ozone treatment, organic foreign bodies that have probably adhered thereto can be washed and removed. At the same time, organic foreign bodies contained in the washing liquid itself are also decomposed and depolymerized by the ozone treatment. As a result, re-adhesion of solid materials is suppressed, whereby the density of foreign bodies can be significantly reduced.

The ozone treatment can be performed, for example, by exposing the washing water to an ozone-containing clean air generated in an ozonizer or the like. In the present invention, the ozone concentration in the washing water may be 3 ppm or more, preferably 6 ppm or more, even more preferably 9 ppm or more, and still more preferably 20 ppm or more. The upper limit of the ozone concentration is not particularly set, but is generally about 200 ppm.

BRIEF DESCRIPTION OF THE DRAWINGS

The figure is a schematic view explaining blisters in the laminate including a polyimide film and an inorganic substrate of the present invention.

MODE FOR CARRYING OUT THE INVENTION

In a laminate of the present invention, an inorganic substrate is used as a supporting substrate. An inorganic substrate is a plate-like article made of an inorganic substance, and examples thereof include a glass plate, a ceramic plate, a semiconductor wafer, and a metal plate. In addition, it is also possible to use a composite substrate composed of a laminate of two or more kinds selected from a glass plate, a ceramic plate, a semiconductor wafer, and a metal plate. Further, the examples also include a composite in which at least one kind of material selected from glasses, ceramics, and metals is dispersed in powder form in another inorganic material or organic material. Further, the examples also include a substrate material having a fiber-reinforced composite structure in which at least one kind of fibrous material selected from glasses, ceramics, and metals is composited in another inorganic material or organic material.

Examples of glasses for use in a glass plate and a glass-containing substrate, which serve as the inorganic substrate in the present invention, include quartz glass, high-silicate glass (96% silica), soda lime glass, lead glass, alumino borosilicate glass, borosilicate glass (Pyrex®), borosilicate glass (non-alkali), borosilicate glass (microsheet), and aluminosilicate glass. Among them, desirable glass for the present invention is the one having a coefficient of linear thermal expansion of 5 ppm/K or less, As commercially available products, "Corning® 7059", "Corning® 1737", and "EAGLE XG" manufactured by Corning Incorporated, "AN100" manufactured by AGC Inc., "OA10G" manufactured by Nippon Electric Glass Co., Ltd., "AF32" manufactured by SCHOTT AG, and the like, which are glasses for liquid crystal display elements, are desirably used.

A ceramic plate to serve as the inorganic substrate in the present invention may be, for example, a ceramic plate made of at least one kind of material selected from ceramics for substrates such as alumina, mullite, aluminum nitride, silicon carbide, silicon nitride, boron nitride, crystallized glass, cordierite, spodumene, $Pb-BSG+CaZrO_3+Al_2O_3$, crystallized glass+$Al_2O_3$, crystallized Ca-borosilicate glass, borosilicate glass+quartz, borosilicate glass+$Al_2O_3$, Pb+borosilicate glass+$Al_2O_3$, glass ceramic, and Zerodur materials; capacitor materials such as titanium oxide, strontium titanate, calcium titanate, magnesium titanate, alumina, magnesia, steatite, $BaTi_4O_9$, $BaTi_4O_9+CaZrO_3$, BaSrCaZrTiO, $Ba(TiZr)O_3$, PMN-PT, and PFN-PFW; and piezoelectric materials such as $PbNb_2O_6$, $Pb_{0.5}Be_{0.5}Nb_2O_6$, $PbTiO_3$, $BaTiO_3$, PZT, 0.855PZT-95PT-0.5BT, 0.873PZT-0.97PT-0.3BT, and PLZT.

Examples of metal materials constituting the metal plate in the present invention include single element metals, such as W, Mo, Pt, Fe, Ni, and Au, and alloys, such as Inconel, Monel, Nimonic, carbon copper, Fe—Ni-based Invar alloy, and Super-Invar alloy. In addition, the examples also include multilayer metal plates obtained by adding other metal layers or ceramic layers to the above metals. In this case, when the entire CTE including the additional layers is low, Cu, Al, or the like is also used for the main metal layer. Metals used for the additional metal layers are not limited as long as they have characteristics of strengthening the adhesion to a polyimide film, having no diffusion, and having excellent chemical resistance and heat resistance, and the like; Chromium, nickel, TiN, and Mo-containing Cu can be mentioned as preferred examples.

Semiconductor wafers in the present invention are exemplified by silicon wafers, silicon carbide wafers, compound semiconductor wafers. A silicon wafer, which is obtained by processing monocrystalline or polycrystalline silicon into a thin plate, includes all n-doped or p-doped silicon wafers and intrinsic silicon wafers, and also includes silicon wafers having a silicon oxide layer or various thin films deposited on the silicon wafer surface. In addition to silicon wafers, it is also possible to use semiconductor wafers, compound semiconductor wafers, and the like, including germanium, silicon-germanium, gallium-arsenic, aluminum-gallium-indium, nitrogen-phosphorus-arsenic-antimony, SiC, InP (indium phosphide), InGaAs, GaInNAs, LT, LN, ZnO (zinc oxide), CdTe (cadmium tellurium), and ZnSe (zinc selenide), and the like.

The area of the inorganic substrate in the present invention is preferably 0.157 $m^2$ or more. More specifically, a rectangle 45 cm or more in long side and 35 cm or more in short side is preferable.

Such an inorganic substrate to serve as a support may be subjected to an activation treatment, such as a UV ozone treatment, a vacuum plasma treatment, an atmospheric pressure plasma treatment, a corona treatment, a flame treatment, an itro treatment, a UV ozone treatment, or exposure to an active gas. These treatments mainly have a cleaning effect of removing contaminants adhering to the inorganic substrate surface such as organic substances, and also have an effect of activating the inorganic substrate surface and improving the adhesion to the polyimide film.

The polyimide in the present invention is a polymer having an imide bond. Generally, a polyimide is obtained as a condensate of a tetracarboxylic dianhydride and a diamine. As a common production method for a polyimide, a method is known in which a polyamide acid (polyimide precursor) solution obtained by a reaction between a tetracarboxylic dianhydride and a diamine in a solvent is applied to a support and dried into a precursor film, and an imidization reaction is induced by heating or a catalytic action to convert the precursor into a polyimide. According to a common method for forming a polyimide into a film, a precursor film is separated from a support and imidized. In addition, for an application in which the support is covered, a technique of imidization without separation is also known. The method in which a precursor solution is applied onto a support, dried, and imidized on the support has been studied for practical use for an application in which a polyimide film is used as a substrate of a flexible device.

As the tetracarboxylic dianhydride in the present invention, an aromatic tetracarboxylic dianhydride or an alicyclic tetracarboxylic dianhydride can be preferably used. In light of heat resistance, aromatic tetracarboxylic dianhydrides are preferable, and in light of light transmittance, alicyclic tetracarboxylic dianhydrides are preferable. Tetracarboxylic dianhydrides may be used alone, and two or more kinds of tetracarboxylic dianhydrides may be used together.

Examples of aromatic tetracarboxylic acids in the present invention include pyromellitic dianhydride, 3,3',4,4'-biphenyltetracarboxylic dianhydride, 4,4'-oxydiphthalic dianhydride, 3,3',4,4'-benzophenonetetracarboxylic dianhydride, 3,3',4,4'-diphenylsulfonetetracarboxylic dianhydride, and 2,2-bis[4-(3,4-dicarboxyphenoxy)phenyl]propanoic anhydride. In the present invention, it is preferable to use pyromellitic dianhydride.

Examples of alicyclic tetracarboxylic acids in the present invention include alicyclic tetracarboxylic acids such as cyclobutanetetracarboxylic acid, 1,2,4,5-cyclohexanetetracarboxylic acid, 3,3',4,4'-bicyclohexyltetracarboxylic acid, and acid anhydrides thereof. Among them, dianhydrides having two anhydride structures (e.g., cyclobutanetetracarboxylic dianhydride, 1,2,4,5-cyclohexanetetracarboxylic dianhydride, 3,3',4,4'-bicyclohexyl tetracarboxylic dianhydride, etc.) are preferable. Alicyclic tetracarboxylic acids may be used alone, and two or more kinds of alicyclic tetracarboxylic acids may be used together.

In the case where transparency is considered as important, for example, the alicyclic tetracarboxylic acid is preferably 80 mass % or more, more preferably 90 mass % or more, and still more preferably 95 mass % or more, of all the tetracarboxylic acids.

Diamines in the present invention are not particularly limited, and aromatic diamines, aliphatic diamines, and alicyclic diamines commonly used for polyimide synthesis can be used. In light of heat resistance, aromatic diamines are preferable. Among aromatic diamines, aromatic diamines having a benzoxazole structure can be used. When the aromatic diamine having a benzoxazole structure is used, a high elastic modulus, low heat shrinkability, and a low coefficient of linear thermal expansion can be developed together with high heat resistance. Diamines may be used alone, and two or more kind of diamines may be used together.

Of diamines in the present invention, examples of aromatic diamines include 2,2'-dimethyl-4,4'-diaminobiphenyl, 1,4-bis[2-(4-aminophenyl)-2-propyl]benzene (bisaniline), 1,4-bis(4-amino-2-trifluoromethylphenoxy)benzene, 2,2'-ditrifluoromethyl-4,4'-diaminobiphenyl, 4,4'-bis(4-aminophenoxy)biphenyl, 4,4'-bis(3-aminophenoxy)biphenyl, bis[4-(3-aminophenoxy)phenyl]ketone, bis[4-(3-aminophenoxy)phenyl]sulfide, bis[4-(3-aminophenoxy)phenyl]sulfone, 2,2-bis[4-(3-aminophenoxy)phenyl]propane, 2,2-bis[4-(3-aminophenoxy)phenyl]-1,1,1,3,3,3-hexafluoropropane, m-phenylenediamine, o-phenylenediamine, p-phenylenediamine, m-aminobenzylamine, p-aminobenzylamine, 3,3'-diaminodiphenyl ether, 3,4'-diaminodiphenyl ether, 4,4'-diaminodiphenyl ether, 3,3'-diaminodiphenylsulfide, 3,3'-diaminodiphenylsulfoxide, 3,4'-diaminodiphenylsulfoxide, 4,4'-diaminodiphenylsulfoxide, 3,3'-diaminodiphenylsulfone, 3,4'-diaminodiphenylsulfone, 4,4'-diaminodiphenylsulfone, 3,3'-diaminobenzophenone, 3,4'-diaminobenzophenone, 4,4'-diaminobenzophenone, 3,3'-diaminodiphenylmethane, 3,4'-diaminodiphenylmethane, 4,4'-diaminodiphenylmethane, bis[4-(4-aminophenoxy)phenyl]methane, 1,1-bis[4-(4-aminophenoxy)phenyl]ethane, 1,2-bis[4-(4-aminophenoxy)phenyl]ethane, 1,1-bis[4-(4-aminophenoxy)phenyl]propane, 1,2-bis[4-(4-aminophenoxy)phenyl]propane, 1,3-bis[4-(4-aminophenoxy)phenyl]propane, 2,2-bis[4-(4-aminophenoxy)phenyl]propane, 1,1-bis[4-(4-aminophenoxy)phenyl]butane, 1,3-bis[4-(4-aminophenoxy)phenyl]butane, 1,4-bis[4-(4-aminophenoxy)phenyl]butane, 2,2-bis[4-(4-aminophenoxy)phenyl]butane, 2,3-bis[4-(4-aminophenoxy)phenyl]butane, 2-[4-(4-aminophenoxy)phenyl]-2-[4-(4-aminophenoxy)-3-methylphenyl]propane, 2,2-bis[4-(4-aminophenoxy)-3-methylphenyl]propane, 2-[4-(4-aminophenoxy)phenyl]-2-[4-(4-aminophenoxy)-3,5-dimethylphenyl]propane, 2,2-bis[4-(4-aminophenoxy)-3,5-dimethylphenyl]propane, 2,2-bis[4-(4-aminophenoxy)phenyl]-1,1,1,3,3,3-hexafluoropropane, 1,4-bis(3-aminophenoxy)benzene, 1,3-bis(3-aminophenoxy)benzene, 1,4-bis(4-aminophenoxy)benzene, 4,4'-bis(4-aminophenoxy)biphenyl, bis[4-(4-aminophenoxy)phenyl]ketone, bis[4-(4-aminophenoxy)phenyl]sulfide, bis[4-(4-aminophenoxy)phenyl]sulfoxide, bis[4-(4-aminophenoxy)phenyl]sulfone, bis[4-(3-aminophenoxy)phenyl]ether, bis[4-(4-aminophenoxy)phenyl]ether, 1,3-bis[4-(4-aminophenoxy)benzoyl]benzene, 1,3-bis[4-(3-aminophenoxy)benzoyl]benzene, 1,4-bis[4-(3-aminophenoxy)benzoyl]benzene, 4,4'-bis[(3-aminophenoxy)benzoyl]benzene, 1,1-bis[4-(3-aminophenoxy)phenyl]propane, 1,3-bis[4-(3-aminophenoxy)phenyl]propane, 3,4'-diaminodiphenylsulfide, 2,2-bis[3-(3-aminophenoxy)phenyl]-1,1,1,3,3,3-hexafluoropropane, bis[4-(3-aminophenoxy)phenyl]methane, 1,1-bis[4-(3-aminophenoxy)phenyl]ethane, 1,2-bis[4-(3-aminophenoxy)phenyl]ethane, bis[4-(3-aminophenoxy)phenyl]sulfoxide, 4,4'-bis[3-(4-aminophenoxy)benzoyl]diphenyl ether, 4,4'-bis[3-(3-aminophenoxy)benzoyl]diphenyl ether, 4,4'-bis[4-(4-amino-α,α-dimethylbenzyl)phenoxy]benzophenone, 4,4'-bis[4-(4-amino-α,α-dimethylbenzyl)phenoxy]diphenylsulfone, bis[4-{4-(4-aminophenoxy)phenoxy}phenyl]sulfone, 1,4-bis[4-(4-aminophenoxy)phenoxy-α,α-dimethylbenzyl]benzene, 1,3-bis[4-(4-aminophenoxy)phenoxy-α,α-dimethylbenzyl]benzene, 1,3-bis[4-(4-amino-6-trifluoromethylphenoxy)-α,α-dimethylbenzyl]benzene, 1,3-bis[4-(4-amino-6-fluorophenoxy)-α,α-dimethylbenzyl]benzene, 1,3-bis[4-(4-amino-6-methylphenoxy)-α,α-dimethylbenzyl]benzene, 1,3-bis[4-(4-amino-6-cyanophenoxy)-α,α-dimethylbenzyl]benzene, 3,3'-diamino-4,4'-diphenoxybenzophenone, 4,4'-diamino-5,5'-phenoxybenzophenone, 3,4'-diamino-4,5'-diphenoxybenzophenone, 3,3'-diamino-4- phenoxybenzophenone, 4,4'-diamino-5-phenoxybenzophenone, 3,4'-diamino-4-phenoxybenzophenone, 3,4'-diamino-5'-phenoxybenzophenone, 3,3'-diamino-4,4'-diphenoxybenzophenone, 4,4'-diamino-5,5'-diphenoxybenzophenone, 3,4'-diamino-4,5'-diphenoxybenzophenone, 3,3'-diamino-4-biphenoxybenzophenone, 4,4'-diamino-5-biphenoxybenzophenone, 3,4'-diamino-4-biphenoxybenzophenone, 3,4'-diamino-5'-biphenoxybenzophenone, 1,3-bis(3-amino-4-phenoxybenzoyl)benzene, 1,4-bis(3-amino-4-phenoxybenzoyl)benzene, 1,3-bis(4-amino-5-phenoxvbenzovl)benzene, 1,4-bis(4-amino-5-phenoxybenzoyl)benzene, 1,3-bis(3-amino-4-biphenoxybenzoyl)benzene, 1,4-bis(3-amino-4-biphenoxybenzoyl)benzene, 1,3-bis(4-amino-5-biphenoxybenzoyl)benzene, 1,4-bis(4-amino-5-biphenoxybenzoyl)benzene, and 2,6-bis[4-(4-amino-α,α-dimethylbenzyl)phenoxy]benzonitrile, as well as aromatic diamines in which hydrogen atoms on the aromatic ring of the above aromatic diamine are partially or completely substituted by a halogen atom, a $C_{1-3}$ alkyl group or alkoxyl group, a cyano group, or a $C_{1-3}$ halogenated alkyl group or alkoxyl group in which hydrogen atoms of the alkyl group or the alkoxyl group are partially or completely substituted by a halogen atom.

Examples of aliphatic diamines in the present invention include 1,2-diaminoethane, 1,4-diaminobutane, 1,5-diaminopentane, 1,6-diaminohexane, and 1,8-diaminooctane.

Examples of alicyclic diamines in the present invention include 1,4-diaminocyclohexane and 4,4'-methylenebis(2,6-dimethylcyclohexylamine).

Examples of diamines having a benzoxazole structure in the present invention include 5-amino-2-(p-aminophenyl)benzoxazole, 6-amino-2-(p-aminophenyl)benzoxazole, 5-amino-2-(m-aminophenyl)benzoxazole, 6-amino-2-(m-aminophenyl)benzoxazole, 2,2'-p-phenylenebis(5-aminobenzoxazole), 2,2'-p-phenylenebis(6-aminobenzoxazole), 1-(5-aminobenzoxazole)-4-(6-aminobenzoxazole)benzene, 2,6-(4,4'-diaminodiphenyl)benzo[1,2-d:5,4-d']bisoxazole, 2,6-(4,4'-diaminodiphenyl)benzo[1,2-d:4,5-d']bisoxazole, 2,6-(3,4'-diaminodiphenyl)benzo[1,2-d:5,4-d']bisoxazole, 2,6-(3,4'-diaminodiphenyl)benzo[1,2-d:4,5-d']bisoxazole, 2,6-(3,3'-diaminodiphenyl)benzo[1,2-d:5,4-d']bisoxazole, and 2,6-(3,3'-diaminodiphenyl)benzo[1,2-d:4,5-d']bisoxazole.

The polyimide preferably used in the present invention is preferably a film made of a condensate of an aromatic tetracarboxylic dianhydride and an aromatic diamine. Further, it is preferable to use at least one kind of polyimide film selected from
  (a) a film made of a condensate of an aromatic tetracarboxylic dianhydride and a diamine containing at least a diamine having a benzoxazole skeleton,
  (b) a film made of a condensate of an aromatic tetracarboxylic dianhydride and a diamine containing at least an ether bond in the molecule,
  (c) a film made of a condensate of an aromatic tetracarboxylic dianhydride and a diamine containing at least phenylenediamine, and
  (d) a film made of a condensate of a biphenyltetracarboxylic dianhydride and an aromatic diamine.

The film thickness of the polyimide film in the present invention is not particularly limited, but is preferably 0.5 μm to 200 μm, and still more preferably 3 μm to 50 μm. In the case of 0.5 μm or less, it is difficult to control the film thickness, and the polyimide may be partially lost. Meanwhile, in the case of 200 μm or more, manufacturing takes time, and it may be difficult to control the film thickness unevenness. The film thickness unevenness of the polyimide film is indispensably 5% or less, preferably 4% or less, and still more preferably 3% or less.

The film made of a condensate of a tetracarboxylic dianhydride and a diamine, that is, a polyimide film, of the present invention can be obtained by a solution deposition method. The solution deposition method for a polyimide is a method in which using a roll or endless belt of stainless steel or alternatively a polymer film, such as PET, as an elongated or endless support, a precursor solution of a polyimide resin is applied onto the support, dried, and then separated from the support as a polyimide precursor film, and, while transporting the film preferably with each end being held with a clip or a pin, the film is further subjected to a heat treatment to induce a chemical reaction that converts the polyimide precursor into a polyimide, thereby giving a polyimide film. The polyimide film obtained using such a technique is a polyimide film the film thickness unevenness of which is 5% or less, preferably 3.6% or less, and still more preferably 2.4% or less, and the tensile rupture strength of which is 90 MPa or more, preferably 180 MPa or more, still more preferably 350 MPa or more, and yet more preferably 450 MPa or more.

In the present invention, for adjusting the properties of the polyimide film, an inorganic substance can be added to the polyimide, but the amount of such an inorganic substance should be kept to a bare minimum. Generally, when a polymer is formed into a film, a small amount of inorganic particles called "lubricant" are added to positively generate fine convex portions on the film surface. As a result, when a film overlaps a film, or a film overlaps a smooth surface, an air layer is involved therebetween, whereby the slidability of the film is developed. In the present invention, silicon oxide components contained in the polyimide film is preferably kept to preferably 6,000 ppm or less, preferably 4,500 ppm or less, still more preferably 1,800 ppm or less, and yet more preferably 900 ppm or less. Excessive addition of the lubricant may increase the roughness of the film surface and inhibit the separation properties of the second polyimide film.

In the present invention, as a bonding means between the inorganic substrate, which is a support, and the polyimide film, it is possible to use a known adhesive or pressure-sensitive adhesive, such as a silicone resin, an epoxy resin, an acrylic resin, or a polyester resin. However, in the present invention, a bonding means with an extremely thin or substantially no adhesive/pressure-sensitive adhesive layer the thickness of which is 5 μm or less is preferable.

The area of the laminate including a polyimide film and an inorganic substrate in the present invention is preferably 0.157 m² or more. In the case where the polyimide film and the inorganic substrate are different in size, the area of the laminate including a polyimide film and an inorganic substrate means the area of a region where the polyimide film and the inorganic substrate overlap. The area of the laminate including a polyimide film and an inorganic substrate is preferably 0.25 m² or more, still more preferably 0.46 m² or more, yet more preferably 0.62 m² or more, and still yet more preferably 0.98 m² or more.

In the present invention, as a bonding means with substantially no adhesive or pressure-sensitive adhesive, a bonding method using a silane coupling agent can be used. That is, in the present invention, a silane coupling agent layer is preferably present between the inorganic substrate and the polyimide film.

The silane coupling agent in the present invention is a compound that is physically or chemically interposed between the inorganic plate and the polyimide film and has an action to enhance the adhesive force between the two.

Preferred specific examples of the silane coupling agents include N-2-(aminoethyl)-3-aminopropylmethyldimethoxysilane, N-2-(aminoethyl)-3-aminopropyltrimethoxysilane, N-2-(aminoethyl)-3-aminopropyltriethoxysilane, 3-aminopropyltrimethoxysilane, 3-aminopropyltriethoxysilane, 3-triethoxysilyl-N-(1,3-dimethyl-butylidene)propylamine, 2-(3,4-epoxycyclohexyl)ethyltrimethoxysilane, 3-glycidoxypropyltrimetoxysilane, 3-glycidoxypropylmethyldiethoxysilane, 3-glycidoxypropyltriethoxysilane, vinyltrichlorosilane, vinyltrimethoxysilane, vinyltriethoxysilane, 2-(3,4-epoxycyclohexyl)ethyltrimethoxysilane, 3-glycidoxypropyltrimetoxysilane, 3-glycidoxypropylmethyldiethoxysilane, 3-glycidoxypropyltriethoxysilane, p-styryltrimethoxysilane, 3-methacryloxypropylmethyldimethoxysilane, 3-methacryloxypropyltrimethoxysilane, 3-methacryloxypropylmethyldiethoxysilane, 3-methacryloxypropyltriethoxysilane, 3-acryloxypropyltrimethoxysilane, N-phenyl-3-aminopropyltrimethoxysilane, N-(vinylbenzyl)-2-aminoethyl 3-aminopropyltrimethoxysilane hydrochloride, 3-ureidopropyltriethoxysilane, 3-chloropropyltrimetoxysilane, 3-mercaptopropylmethyldimethoxysilane, 3-mercaptopropyltrimethoxysilane, bis(triethoxysilylpropyl)tetrasulfide, 3-isocyanatepropyltriethoxysilane, tris-(3-trimethoxysilylpropyl)isocyanurate, chloromethylphenethyltrimethoxysilane, chloromethyltrimethoxysilane, aminophenyltrimethoxysilane, aminophenethyltrimethoxysilane, aminophenyl aminomethylphenethyltrimethoxysilane, and hexamethyldisilazane.

In addition to the above examples, the examples of the silane coupling agents that can be used in the present invention also include n-propyltrimethoxysilane, butyltrichlorosilane, 2-cyanoethyltriethoxysilane, cyclohexyltrichlorosilane, decyltrichlorosilane, diacetoxydimethylsilane, diethoxydimethylsilane, dimethoxydimethylsilane, dimethoxydiphenylsilane, dimethoxymethylphenylsilane, dodecylchlorosilane, dodecyltrimethoxysilane, ethyltrichlorosilane, hexyltrimethoxysilane, octadecyltriethoxysilane, octadecyltrimethoxysilane, n-octyltrichlorosilane, n-octyltriethoxysilane, n-octyltrimethoxysilane, triethoxyethylsilane, triethoxymethylsilane, trimethoxymethylsilane, trimethoxyphenylsilane, pentyltriethoxysilane, pentyltrichlorosilane, triacetoxymethylsilane, trichlorohexylsilane, trichloromethylsilane, trichlorooctadecylsilane, trichloropropylsilane, trichlorotetradecylsilane, trimethoxypropylsilane, allyltrichlorosilane, allyltriethoxysilane, allyltrimethoxysilane, diethoxymethylvinylsilane, dimethoxymethylvinylsilane, trichlorovinylsilane, triethoxyvinylsilane, vinyltris(2-methoxyethoxy)silane, trichloro-2-cyanoethylsilane, diethoxy(3-glycidyloxypropyl)methylsilane, 3-glycidyloxypropyl(dimethoxy)methylsilane, and 3-glycidyloxypropyltrimethoxysilane.

In addition, other alkoxysilanes, such as tetramethoxysilane and tetraethoxysilane, may be suitably added to the silane coupling agent. Furthermore, in the case where other alkoxysilanes, such as tetramethoxysilane and tetraethoxysilane, are suitably added to the silane coupling agent, or also in the case where no such alkoxysilanes are added, the reaction may be slightly proceeded by mixing or heating before use.

Among such silane coupling agents, a silane coupling agent preferably used in the present invention may have a chemical structure in which the coupling agent has one silicon atom per molecule.

In the present invention, particularly preferred examples of the silane coupling agents includes N-2-(aminoethyl)-3-aminopropylmethyldimethoxysilane, N-2-(aminoethyl)-3-aminopropyltrimethoxysilane, N-2-(aminoethyl)-3-aminopropyltriethoxysilane, 3-aminopropyltrimethoxysilane, 3-aminopropyltriethoxysilane, 3-triethoxysilyl-N-(1,3-dimethyl-butylidene)propylamine, 2-(3,4-epoxycyclohexyl)ethyltrimethoxysilane, 3-glycidoxypropyltrimetoxysilane, 3-glycidoxypropylmethyldiethoxysilane, 3-glycidoxypropyltriethoxysilane, aminophenyl trimethoxysilane, aminophenethyl trimethoxysilane, and aminophenyl aminomethyl phenethyltrimethoxysilane. In the case where particularly high heat resistance is required during the process, one in which Si and the amino group are linked through an aromatic group is desirable. Incidentally, in the present invention, as necessary, a phosphorus-based coupling agent, a titanate-based coupling agent, or the like may also be used together.

The method for applying a silane coupling agent in the present invention is not particularly limited, and a common wet coating method or gas-phase coating method can be used. The wet coating method includes spin coating, capillary coating, bar coating, an applicator, die coating, comma coating, screen printing, gravure printing, ink jet printing, spray coating, and atomization coating, using a liquid concentrate, solvent solution, or preferably alcohol solution of a silane coupling agent, for example.

In the present invention, as the method for applying a silane coupling agent, the gas-phase application method through a gas phase can be preferably used. According to the gas-phase application method, application is performed by exposing the inorganic substrate to a vaporized silane coupling agent. The silane coupling agent application may be paraphrased as a silane coupling agent treatment. Vaporization refers to the state in which vapor of the silane coupling agent, that is, a silane coupling agent substantially in gas state or a silane coupling agent in particulate state, is present. Exposure means that the organic polymer film is in contact with the gas or vacuum state containing the vaporized silane coupling agent described above.

A vapor of the silane coupling agent can be easily obtained by warming the silane coupling agent in liquid state to a temperature of 30° C. to the boiling point of the silane coupling agent. The vapor of the silane coupling agent is generated even below the boiling point. Itis also possible to utilize the state where fine particles of the silane coupling agent coexist. In addition, it is also possible to control the temperature and pressure to increase the vapor density. The boiling point of the silane coupling agent varies depending on the chemical structure, which is generally within a range of 100 to 250° C. However, heating to 200° C. or more may cause a side reaction on the organic group side of the silane coupling agent, and thus is undesirable.

The thickness of the silane coupling agent layer in the present invention is preferably 5 nm or more, preferably 9 nm or more, preferably 18 nm or more, and yet more preferably 45 nm or more. The upper limit of the film thickness of the silane coupling agent is preferably 500 nm or less, still more preferably 390 nm or less, and yet more preferably 240 nm or less. The film thickness of the silane coupling agent can be measured by the electron microscopic observation of a cross-section of the laminate.

The environment in which the silane coupling agent is warmed may be any of increased pressure, atmospheric pressure, and reduced pressure. In the case of promoting the vaporization of the silane coupling agent, the environment is preferably approximately atmospheric pressure or reduced pressure. Since silane coupling agents are often classified into a flammable liquid, the vaporization operation is preferably performed in an airtight container preferably after the container has been purged with an inert gas.

Meanwhile, in light of enhancing the production efficiency and reducing the production facility cost, it is desirable to apply the silane coupling agent in an environment using no vacuum condition. For example, an organic polymer film is set in a chamber at atmospheric pressure, and the chamber is filled with a carrier gas of approximately atmospheric pressure containing a vaporized silane coupling agent to deposit the silane coupling agent, and then the chamber is returned to a state where the vaporized silane coupling agent is not present; these operations can be completed at approximately atmospheric pressure.

The polyimide film to serve as the polyimide film of the present invention may be, at least on the side to which the inorganic substrate is attached, subjected to an activation treatment such as a UV ozone treatment, a vacuum plasma treatment, an atmospheric pressure plasma treatment, a corona treatment, a flame treatment, an itro treatment, an acid treatment, an alkali treatment, or exposure to an active gas. These treatments mainly have a cleaning effect of removing contaminants such as organic substances adhering to the polyimide film surface, and also an effect of activating the polyimide film surface to improve the adhesion to the inorganic substrate.

A method for producing a polyimide/inorganic substrate laminate by laminating an inorganic substrate and a polyimide film through a silane coupling material include stacking an inorganic substrate to which a silane coupling agent is applied on a polyimide film, or stacking an inorganic substrate on a polyimide film to which a silane coupling agent is applied, followed by laminating the two by applying pressure. In addition, the inorganic substrate and the polyimide film may be both treated with a silane coupling agent. The method for applying pressure includes ordinary pressing performed in air at ordinary temperature or under heating, and pressing in vacuum. The preferred pressure is 0.5 MPa to 20 MPa, still more preferably 2 to 10 MPa. Higher pressure may cause the substrate to be damaged, while lower pressure may prevent them from adhering to each other in part. The preferred temperature range is 0° C. to 550° C., still more preferably 10° C. to 300° C. Too high temperatures may cause the film and the inorganic substrate to be degraded. In the case of pressing in vacuum, the degree of vacuum achieved by an ordinary oil-sealed rotary pomp is sufficient, which is about 10 Torr or less.

In addition, after once laminated, the laminate may be subjected to a heat treatment to stabilize the adhesion. The heat treatment temperature at this time is preferably within a range of 50° C. to 550° C., and more preferably within a range of 100° C. to 500° C. As a result of the heat treatment, the adhesion stability can be enhanced. Temperatures of 50° C. or less tend to produce small effect on enhancing adhesion stability, while temperatures of more than 550° C. tend to cause the polyimide film further thermal degradation.

In addition, as a method for producing the laminate including a polyimide film and an inorganic substrate, it is also possible to employ a method in which a solution obtained by dissolving the polyimide or a precursor thereof in an organic solvent is poured onto the inorganic substrate, followed by a heating treatment to form a polyimide film. The solvent may be any solvent as long as it is capable of dissolving a polyimide or a polyimide precursor, and an aprotic polar solvent can be preferably used, for example. Examples thereof include N,N-di-lower-alkyl carboxylamides such as N,N-dimethylformamide, N,N-dimethylacetamide, N,N-diethylacetamide, and N,N-dimethylmethoxyacetamide; N-methyl-2-pyrrolidone, N-ethyl-2-pyrrolidone, dimethyl sulfoxide, dimethyl sulfone, 1,3-dimethyl-2-imidazolidinone, γ-butyrolactone, diglyme, m-cresol, hexamethylphosphoramide, N-acetyl-2-pyrrolidone, hexamethylphosphoramide, ethylcellosolve acetate, diethylene glycol dimethyl ether, sulfolane, and p-chlorophenol. The solvent may be a mixture of two or more kinds.

The conditions for the heating treatment for iridizing a polyimide precursor are not particularly limited. However, the heating treatment is preferably performed at a temperature range of at least 150° C. to 200° C., more preferably 160° C. to 190° C. for 10 minutes or more, preferably 30 minutes or more, and particularly preferably 60 minutes or more, followed by heating at a temperature range where the highest temperature is 400° C. to 550° C., preferably 430° C. to 530° C., and more preferably 460° C. to 530° C. In addition, the time of heating at a temperature of 200° C. or more (including the time heating at the highest temperature) can be suitably determined and is not particularly limited. This treatment makes the solvent evaporate to form a polyimide, which can produce an excellent polyimide/inorganic substrate laminate.

In addition, a method in which a solution obtained by dissolving the polyimide or a precursor thereof in an organic solvent is applied onto an inorganic substrate and, in some cases, partially dried, and then a polyimide film is laminated thereon, followed by drying, is also possible. Furthermore, it is also possible to employ a known technique in which a solution obtained by dissolving the polyimide or a precursor thereof in an organic solvent is applied onto an inorganic substrate and, in some cases, partially dried, and a solution obtained by dissolving a different kind polyimide or a precursor thereof in an organic solvent is applied onto the inorganic substrate, followed by drying.

"Blisters" in the present invention means, in the laminate including a polyimide film and an inorganic substrate, defects caused by the swelling of the polyimide film side like a tent or a dome due to voids created between the polyimide film and the inorganic substrate. Blisters in the present invention are those having a size visible to the naked eye. More specifically, providing a blister observed in the plane direction is expressed as a circle, those having a diameter of 50 μm or more are referred to. Incidentally, in the case where a blister is distorted, the diameter herein is an average of the longest diameter and the shortest diameter.

In the laminate including a polyimide film and an inorganic substrate of the present invention, the number of blisters having a height of 3 μm or more per $m^2$ is preferably 10 or less, still more preferably 7 or less, still more preferably 4 or less, still more preferably 2 or less, and yet more preferably 0.

Further, in the present invention, the number of blisters having a height of 2.2 μm or more per $m^2$ is preferably 10 or less, still more preferably 7 or less, still more preferably 4 or less, still more preferably 2 or less, and yet more preferably 0.

Further, in the present invention, the number of blisters having a height of 1.4 μm or more per $m^2$ is preferably 10 or less, still more preferably 7 or less, still more preferably 4 or less, still more preferably 2 or less, and yet more preferably 0.

Further, in the present invention, the number of blisters having a height of 0.8 μm or more per $m^2$ is preferably 10 or less, still more preferably 7 or less, still more preferably 4 or less, still more preferably 2 or less, and yet more preferably 0.

The number density of the total number of blisters in the present invention is preferably 50/m² or less.

The height of blisters in the present invention can be measured under a 3D laser microscope. The average height of the blister defects in the present invention is preferably 2 µm or less, more preferably 1.6 µm or less, still more preferably 1.2 µm or less, and even more preferably 0.8 µm or less. When the average height of the blister defects is more than this range, the production yield significantly decreases.

In the present invention, the product of the number density of blisters (blisters/m²) and the average height of blisters (µm) is preferably 20 or less. While the height of blisters is an important factor in determining the quality of the laminate of the present invention, the average height of blisters is calculated to be low in the case where a large number of low-height blisters are present. However, the product of the average height of blisters and the number distribution of blisters can be used as a parameter effective in improving the flexible device production yield.

The present invention, in particular, focuses on the blisters containing carbide particles (carbide foreign bodies) in the above voids. A carbide is a substance that is black or dark brown and satisfies at least one of the following conditions: the total of C-element and O-element is more than 50% of all the elements with SEM-EDX; and a spectrum peculiar to carbides is observed in microscopic IR analysis.

In the case of using a glass plate as the inorganic substrate, by observation from the glass plate side, the color of the contained foreign bodies (particles) can be easily distinguished. In the case of an opaque inorganic substrate, the film side can be cut open and observed.

The laminate including a polyimide film and an inorganic substrate of the present invention can be obtained by laminating a polyimide film and an inorganic substrate, followed by a heat treatment at a temperature of 350° C. or more and less than 600° C. The lower limit of the heat treatment temperature is preferably 370° C. or more, preferably 390° C. or more, and preferably 420° C. or more. In addition, the upper limit of the heat treatment temperature is preferably 560° C. or less, still more preferably 520° C. or less, preferably 490° C. or less, and yet more preferably 460° C. or less. In the case where the heat treatment temperature does not reach the predetermined range, the carbonization of foreign bodies may not sufficiently proceed. Meanwhile, heat treatment temperatures of more than the predetermined range cause the polyimide film to degrade increasingly, and is subject to troubles such as film breakage upon separation from the substrate of the flexible device are likely to occur.

The time of the heat treatment may be such that after reaching a predetermined temperature, the temperature is maintained for 5 seconds or more, preferably 30 seconds or more, and still more preferably 100 seconds or more, followed by cooling. The maintenance time prolonged more than necessary tends to cause the polyimide film to degrade.

The temperature rise rate is preferably 5 C/min to 200° C./min. The temperature rise rate of 200° C./min or more may cause the number of blisters to increase.

In the present invention, after the polyimide film and the inorganic substrate are laminated, the laminate is subjected to a heat treatment at a temperature of 350° C. or more and less than 600° C., and then, preferably cooled to at least 200° C. at a rate of 10° C./min or more and 90° C./min or less. The cooling rate is preferably 15° C./min or more, and still more preferably 25° C./min. The upper limit of the cooling rate is preferably 80° C./min or less, still more preferably 70° C./min or less, and yet more preferably 60° C./min or less.

EXAMPLES

Hereinafter, the present invention will be described in further detail with reference to examples and comparative examples. However, the present invention is not limited to the following examples. Incidentally, the physical property evaluation method, the treatment method, the operation method, and the like in the following examples are as follows.

<Reduced Viscosity of Polyamide Acid (Nsp/C)>

A solution was prepared by dissolution in N-methyl-2-pyrrolidone (or N,N-dimethylacetamide) such that a polymer concentration was 0.2 g/dl, the reduced viscosity of which was measured at 30° C. with an Ubbelohde viscosity tube. (In the case where the solvent used in the preparation of a polyamide acid solution was N,N-dimethylacetamide, the polymer was dissolved using N,N-dimethylacetamide and subjected to the measurement.)

<Film Thickness of Polyimide Film>

The thickness of a polyimide film was determined by the SEM cross-section observation of a laminate cross-section. Incidentally, unless otherwise noted, in a region 1 mm or more inside each end of the polyimide film, five points were selected at random for the measurement, and the average film thickness at these points was defined as the film thickness of the polyimide film.

For a second polyimide film, in a polyimide film before lamination or a film after the 900 peel of a second polyimide film from a laminate, ten points were selected at random for the measurement, and their arithmetic average was determined and defined as the film thickness. In addition, from the maximum, minimum, and arithmetic average of the film thickness at arbitrary ten points, the film thickness unevenness [%] was calculated by the following formula.

$$\text{Film thickness unevenness}=100\times(\text{maximum}-\text{minimum})/\text{arithmetic average [\%]}$$

The thickness of the second polyimide film was measured using a stylus film thickness meter. When the films were easily separated, the film thickness unevenness of the polyimide film after separation and the film thickness and film thickness unevenness of the polyimide film before lamination were almost the same.

<Thermal Decomposition Temperature>

A polyimide film separated from a laminate (polyimide film) was used as a sample. The sample was dried at 150° C. for 30 minutes and then subjected to thermobalance analysis (TGA) under the following conditions. The temperature at which the mass of the sample decreased by 5% was defined as the thermal decomposition temperature.

Device name: TG-DTA 2000S by manufactured by MAC Science
Pan: Aluminum pan (non-airtight)
Sample mass: 10 mg
Temperature rise start temperature: 30° C.
Temperature rise rate: 20° C./min
Atmosphere: Argon <Coefficient of Linear Thermal Expansion>

In a sample obtained as a polyimide film (film), the stretch ratio was measured under the following conditions, and the stretch ratio/temperature was measured at 30° C. to 45° C., 45° C. to 60° C., . . . that is, at 15° C. intervals. The measurement was performed up to 300° C., and the average of all the measured values was calculated as CTE.

Apparatus name: TMA4000S by MAC Science
Sample length: 20 mm
Sample width: 2 mm
Temperature increase onset temperature: 25° C.
Temperature increase finish temperature: 400° C.
Temperature rise rate: 5° C./min
Atmosphere: Argon <Number of Blister Defects>

The number of blisters visible to the naked eye was counted. The average size of detectable blisters is 50 μm or more.

<Measurement of Height of Blister Defects>

The height of blister parts (convex defects) in a laminate including a polyimide film and an inorganic substrate was measured using the height measuring function of a color 3D laser microscope VK9710 manufactured by KEYENCE corporation.

<Thickness of Silane Coupling Agent Layer>

The thickness was measured from an electron micrograph of a cross-section of a laminate including a polyimide film and an inorganic substrate.

<Analysis of Foreign Bodies>

The polyimide film was cut open at a blister part internally containing foreign bodies, and the foreign bodies were subjected to microscopic IR measurement. When the obtained IR spectrum absorption was entirely gentle and wide, and a resin-derived characteristic absorption was not seen in a region of 1,000 to 3,500 $cm^{-1}$, such foreign bodies were identified as carbides.

Production Examples

[Production of Polyimide Precursor (Polyamide Acid) Solution PV]

After a reactor equipped with a nitrogen-introducing tube, a thermometer, and a stirring rod was purged with nitrogen, 223 parts by mass of 5-amino-2-(p-aminophenyl)benzoxazole and 4,416 parts by mass of N,N-dimethylacetamide were added and completely dissolved, followed by 217 parts by mass of pyromellitic dianhydride. The mixture was stirred at a reaction temperature of 25° C. for 24 hours to obtain a brown, viscous polyamide acid solution [PV].

[Production of Polyimide Precursor (Polyamide Acid) Solution PV2]

After a reactor equipped with a nitrogen-introducing tube, a thermometer, and a stirring rod was purged with nitrogen, 398 parts by mass of 3,3',4,4'-biphenyltetracarboxylic dianhydride as a tetracarboxylic dianhydride, 132 parts by mass of paraphenylenediamine, and 30 parts by mass of 4,4'-diaminodiphenyl ether were dissolved in 4,600 parts by mass of N,N-dimethylacetamide. The mixture was stirred at a reaction temperature of 25° C. for 24 hours to obtain a brown, viscous polyamide acid solution [PV2].

[Production of Polyimide Precursor (Polyamide Acid) Solution PV3]

After a reactor equipped with a nitrogen-introducing tube, a thermometer, and a stirring rod was purged with nitrogen, 545 parts by mass of pyromellitic anhydride and 500 parts by mass of 4,4'-diaminodiphenyl ether were dissolved in 8,000 parts by mass of N,N-dimethylacetamide. The mixture was reacted in the same manner while maintaining the temperature at 20° C. or less to obtain a polyamide acid solution [PV3].

[Production of Polyimide Precursor (Polyamide Acid) Solution PV4]

After a reactor equipped with a nitrogen-introducing tube, a thermometer, and a stirring rod was purged with nitrogen, 545 parts by mass of pyromellitic dianhydride, 153 parts by mass of paraphenylenediamine, 200 parts by mass of 4,4'-diaminodiphenyl ether were dissolved in 8,000 parts by mass of N,N-dimethylacetamide. The mixture was reacted in the same manner while maintaining the temperature at 20° C. or less to obtain a polyamide acid solution [PV4].

[Production of Polyimide Precursor (Polyamide Acid) Solution PV5]

After a reactor equipped with a nitrogen-introducing tube, a thermometer, and a stirring rod was purged with nitrogen, 155.9 parts by mass of 2,2'-dimethyl-4,4'-diaminobiphenyl and 1,200 parts by mass of N,N-dimethylacetamide were placed in the reactor in a nitrogen atmosphere and dissolved. Subsequently, while cooling the reactor, 142.9 parts by mass of cyclobutanetetracarboxylic dianhydride in solid form was divided and added, followed by stirring at room temperature for 5 hours. Subsequently, the mixture was diluted with 1,000 parts by mass of N,N-dimethylacetamide to obtain a polyamide acid solution [PV5] having a reduced viscosity of 4.20 dl/g.

[Production of Polyimide Precursor (Polyamide Acid) Solution PV6]

After a reactor equipped with a nitrogen-introducing tube, a thermometer, and a stirring rod was purged with nitrogen, 176.5 parts by mass of 2,2'-ditrifluoromethyl-4,4'-diaminobiphenyl and 1,200 parts by mass of N,N-dimethylacetamide were placed in the reactor in a nitrogen atmosphere and dissolved. Subsequently, while cooling the reactor, 122.9 parts by mass of 1,2,4,5-cyclohexanetetracarboxylic dianhydride in solid form was divided and added, followed by stirring at room temperature for 18 hours. Subsequently, the mixture was diluted with 500 parts by mass of N,N-dimethylacetamide to obtain a polyamide acid solution [PV6] having a reduced viscosity of 3.26 dl/g.

[Production of Polyimide Precursor (Polyamide Acid) Solution PV7]

After a reactor equipped with a nitrogen-introducing tube, a thermometer, and a stirring rod was purged with nitrogen, 398 parts by mass of 3,3',4,4'-biphenyltetracarboxylic dianhydride as a tetracarboxylic dianhydride and 148 parts by mass of paraphenylenediamine were dissolved in 4,600 parts by mass of N,N-dimethylacetamide. The mixture was stirred at a reaction temperature of 25° C. for 24 hours to obtain a brown, viscous polyamide acid solution [PV7].

<Production of Polyimide Film>

The polyamide acid solution [PV1] obtained in the Production Examples was degassed, then applied using a comma coater to a smooth surface of Polyester Film A4100 manufactured by Toyobo Co., Ltd., and dried using a continuous dryer at a drying temperature of 95° C. for 5 minutes and then at 110° C. for 10 minutes, to obtain a polyamide acid film. Next, the obtained polyamide acid film was separated from the polyester film. Each end of the film was held with a pin, and the film was subjected to a heat treatment in a continuous heat treating furnace at 250° C. for 3 minutes and then at 485° C. for 3 minutes and cooled to room temperature, to obtain a polyimide film [PFIa]. The evaluation results of the obtained polyimide film are shown in Table 1. "Film deposition" in the table shows that a polyimide film obtained by this method was used.

Hereinafter, in the same manner, solution deposition was performed changing the polyamide acid solution, the deposition method, the applied film thickness, and the drying and heat treatment conditions, to obtain the polyimide films shown in Table 1. The results are shown in Table 1.

<Inorganic Substrate (Support)>

A glass plate for a liquid crystal display, having a size of 370 mm×470 mm, 0.7 mm in thickness, was used as Substrate [G1].

A glass plate for a liquid crystal display, having a size of 550 mm×650 mm, 0.7 mm in thickness, was used as Substrate [G2].

<UV/Ozone Treatment>

Using a UV/ozone washing and reforming device manufactured by Lan Technical Service Co., Ltd., the distance between the lamp and an inorganic substrate was set at 30 mm, and the inorganic substrate was subjected to a UV/ozone treatment for 1 minute.

<Silane Coupling Agent Treatment>

As a silane coupling agent treatment, the following treatment was performed. A chamber equipped with a hot plate and a support base for an inorganic substrate was purged with clean dry nitrogen, and then a UV/ozone-treated inorganic substrate was installed on the support base. A petri dish filled with a silane coupling agent (3-aminopropyltrimethoxysilane) was placed in such a manner that the liquid surface was located 200 mm below the inorganic substrate, and the petri dish was heated with the hot plate to 100° C. to expose the lower surface of the inorganic substrate to a silane coupling agent vapor for 3 minutes. The substrate was then removed from the chamber, installed in a clean bench, placed on a hot place controlled at 120° C. in such a manner that the side of the inorganic substrate opposite to the exposure side was in contact with the hot plate, and thus heat-treated for 1 minute.

<Film Washing Treatment>

The obtained polyimide film was washed using a continuous wet film washing device, and further, while being transported, maintained in clean dry air at 120° C. for 5 minutes to be re-dried. The washing liquid used in the wet washing device was purified through a membrane filter such that a specific resistance became 15 MΩ·cm or more, then exposed to an ozone-containing clean air 2 generated in an ozonizer0 such that an ozone concentration became 10 ppm or more.

<Plasma Treatment>
<Plasma Treatment of Film>

A polyimide film was cut to a size having a long side and a short side respectively 10 mm smaller than those of a glass substrate and treated with a single-wafer vacuum plasma device. As a vacuum plasma treatment, the RF plasma treatment in the RIE mode using parallel plate electrodes was employed. Nitrogen gas was introduced into a vacuum chamber, and a high-frequency power of 13.54 MHz was introduced. The treatment time was 3 minutes.

<Formation of Gas Barrier Layer: Silicon Nitride Thin Film>

Using a common plasma CVD device, a gas barrier layer was formed by the following technique. As raw material gases, silane gas ($SiH_4$), ammonia gas ($NH_3$), nitrogen gas ($N_2$), and hydrogen gas ($H_2$) were used. The supply amount of each gas was 100 sccm for silane gas, 200 sccm for ammonia gas, 500 sccm for nitrogen gas, and 500 sccm for hydrogen gas. The deposition pressure was 60 Pa. The supplied plasma was 3,000 W at 13.58 MHz. During deposition, a bias power of 500 W was applied to the glass plate (substrate holder) at a frequency of 400 kHz.

TABLE 1

| polyimide resin | | [PV1] | [PV1] | [PV1] | [PV2] | [PV3] | [PV4] | [PV5] | [PV6] | [PV7] |
|---|---|---|---|---|---|---|---|---|---|---|
| acid | PMDA | ✓ | ✓ | ✓ | — | ✓ | ✓ | — | — | — |
| component | BPDA | — | — | — | ✓ | — | — | — | — | ✓ |
| | CBA | — | — | — | — | — | — | ✓ | — | — |
| | CHA | — | — | — | — | — | — | — | ✓ | — |
| diamine | ODA | — | — | — | ✓ | ✓ | ✓ | — | — | — |
| component | PDA | — | — | — | ✓ | — | ✓ | — | — | ✓ |
| | DAMBO | ✓ | ✓ | ✓ | — | — | — | — | — | — |
| | BPA | — | — | — | — | — | — | ✓ | — | — |
| | FA | — | — | — | — | — | — | — | ✓ | — |
| polyimide film | | [P F 1 a] | [P F 1 b] | [P F 1 c] | [P F 2] | [P F 3] | [P F 4] | [P F 5] | [P F 6] | [P F 7] |
| drying temperature | ° C. | 110 | 110 | 110 | 110 | 110 | 110 | 110 | 100 | 115 |
| drying time | min | 15 | 15 | 15 | 15 | 15 | 15 | 20 | 25 | 25 |
| highest temperature | ° C. | 485 | 485 | 485 | 485 | 430 | 430 | 310 | 285 | 485 |
| heat treatment time | min | 6 | 8 | 10 | 7 | 7 | 7 | 15 | 20 | 25 |
| deposition method | | film decomposition | film decomposition | film decomposition | film decomposition | film decomposition | film decomposition | film decomposition | film decomposition | film decomposition |
| film thickness | μm | 20 | 25 | 38 | 25 | 25 | 25 | 25 | 25 | 25 |
| film thickness unevenness | % | 4.3 | 3.6 | 3.1 | 2.6 | 3.5 | 3.2 | 1.8 | 3.6 | 2.4 |
| thermal cracking temperature | ° C. | 578 | 578 | 578 | 574 | 563 | 560 | 485 | 490 | 585 |
| CTE | ppm/K | 1.1 | 1.2 | 2.5 | 13.4 | 17.5 | 14.6 | 30.5 | 28.1 | 13.8 |

Abbreviations in Table 1 are as follows.
PMDA: Pyromellitic dianhydride,
BPDA: 3,3',4,4'-Biphenyltetracarboxylic dianhydride,
CBA: Cyclobutanetetracarboxylic dianhydride,
CHA: 1,2,4,5-Cyclohexanetetracarboxylic dianhydride,
ODA: 4,4'-Diaminodiphenyl ether,
PDA: Phenylenediamine,
DAMBO: 5-Amino-2-(p-aminophenyl)benzoxazole,
BPA: 2,2'-Dimethyl-4,4'-diaminobiphenyl,
FA: 2,2'-Ditrifluoromethyl-4,4'-diaminobiphenyl,
CTE: Coefficient of linear thermal expansion Example 1

The polyimide film [PF1a] to serve as a polyimide film was subjected to a plasma treatment. On a silane coupling agent-treated inorganic substrate, the polyimide film was placed to overlap the silane coupling agent-treated surface of the substrate, temporarily pressure-bonded using a roll laminator, then installed in a clean bench, placed on a hot place controlled at 150° C. in such a manner that the inorganic substrate side was in contact with the hot plate, and thus heat-treated for 3 minutes, to obtain a laminate including a polyimide film and an inorganic substrate. The obtained laminate including a polyimide film and an inorganic substrate was stored in an environment having a temperature of 20 to 25° C. and a relative humidity of 65±30% for 12 hours or more.

The obtained laminate including a polyimide film and an inorganic substrate was subjected to a heat treatment in an inert oven at 450° C. for 30 minutes. The laminate was removed from the oven, placed on a separately prepared copper plate controlled at a predetermined temperature of 25° C. or more and 180° C. or less in such a manner that the inorganic substrate (glass plate) side was in contact with the plate, and rapidly cooled to a temperature of 200° C. or less. The cooling rate was controlled with the temperature of the copper plate. The average cooling rate required for cooling from 450° C. to 200° C. was defined as the cooling rate.

The number of blisters present in the obtained laminate including a polyimide film and an inorganic substrate was classified according to the size and counted. Further, the total number of blister was divided by the laminate area to determine the number density. Further, the height of all blisters was measured under a laser microscope, the average was determined, to obtain the product of the average height of blisters and the number density. Five blisters were randomly selected from the counted blisters, the polyimide film side was cut open, and foreign matter particles contained therein were analyzed. As a result, they were all confirmed to be carbide particles.

The results are shown in Table 2. In Table 2, Table 3, and Table 4, "inert" indicates a treatment in a nitrogen-purged atmosphere. In addition, "size 50 µm-1 mm" means 50 µm or more and less than 1 mm, "size 1-2 mm" means 1 mm or more and less than 2 mm, and "size 2-3 mm" means 2 mm or more and 3 mm or less.

Examples 2 to 9, Comparative Examples 1 to 6

Hereinafter, experiments were performed suitably changing the inorganic substrate, the polyimide film, the treatment conditions, and the like, and the polyimide/inorganic substrate laminates of Example 2 to Example 9 and Comparative Examples 1 to 6 shown in Table 2, Table 3, and Table 4 were obtained. The height distribution of blisters present in each laminate is shown in Table 2, Table 3, and Table 4. In the same manner as in Example 1, five blisters were randomly selected in each laminate and subjected to the analysis of blister contents. As a result, the contents were all confirmed to be carbide particles.

TABLE 2

| | | | laminate | | | | |
|---|---|---|---|---|---|---|---|
| | | | Example 1 L1a | Example 2 L1b | Example 3 L1 c | Example 4 L2 | Example 5 L3 |
| film | | | [P F 1 a] | [P F 1 b] | [P F 1 c] | [P F 2] | [P F 3] |
| washed with water pretreated with ozone | | | done | done | done | done | done |
| plasma treatment | | | done | done | not done | done | done |
| substrate | kind | | G1 | G1 | G1 | G2 | G2 |
| | area | m² | 0.1656 | 0.1656 | 0.1656 | 0.3456 | 0.3456 |
| heat treatment | temperature | ° C. | 450 | 550 | 400 | 450 | 450 |
| | time | minute | 30 | 5 | 30 | 60 | 30 |
| | environment | | inert | inert | inert | inert | inert |
| cooling | rate | ° C./min. | 20° C./min. | 30° C./min. | 50° C./min. | 30° C./min. | 30° C./min. |
| | environment | | air | air | air | air | air |
| blister | size 50 µm-1 mm | number | 3 | 1 | 2 | 4 | 6 |
| | size 1 mm-2 mm | number | 1 | 0 | 1 | 2 | 0 |
| | size 2 mm-3 mm | number | 0 | 0 | 0 | 1 | 0 |
| | size 3 mm or more | number | 0 | 0 | 0 | 0 | 0 |
| | total number/m² | | 27 | 6 | 18 | 19 | 19 |
| | average height | µm | 0.72 | 0.30 | 0.63 | 0.82 | 0.45 |
| | average height × total number/m² | | 19.02 | 1.81 | 11.47 | 16.00 | 8.47 |
| blister | height 1-2 µm | number | 7 | 9 | 13 | 16 | 14 |
| | | number/m² | 16.45 | 21.15 | 30.55 | 25.48 | 22.29 |
| | height 2-3 µm | number | 4 | 5 | 6 | 7 | 5 |
| | | number/m² | 9.40 | 11.75 | 14.10 | 11.15 | 7.96 |
| | height 3 µm or more | number | 1 | 3 | 2 | 2 | 1 |
| | | number/m² | 2.35 | 7.05 | 4.70 | 3.18 | 1.59 |
| light-emitting quality of organic EL device | | visual evaluation | good | excellent | good | good | excellent |

TABLE 3

| | | | laminate | | | | |
|---|---|---|---|---|---|---|---|
| | | | Example 6 L4 | Example 7 L5 | Example 8 L6 | Example 9 L7 | Comparative Example 1 L1a |
| film | | | [P F 4] | [P F 5] | [P F 6] | [P F 7] | [P F 1 a] |
| washed with water pretreated with ozone | | | done | done | done | done | done |

TABLE 3-continued

|  |  |  | laminate | | | | |
|---|---|---|---|---|---|---|---|
|  |  |  | Example 6 L4 | Example 7 L5 | Example 8 L6 | Example 9 L7 | Comparative Example 1 L1a |
| plasma treatment |  |  | not done | not done | not done | done | done |
| substrate | kind |  | G2 | G2 | G2 | G2 | G2 |
|  | area | m² | 0.3456 | 0.3456 | 0.3456 | 0.3456 | 0.3456 |
| heat treatment | temperature | ° C. | 450 | 350 | 450 | 450 | — |
|  | time | minute | 30 | 30 | 30 | 30 | — |
|  | environment |  | inert | inert | inert | inert | — |
| cooling | rate | ° C./min. | 30° C./min. | 30° C./min. | 30° C./min. | 50° C./min. | — |
|  | environment |  | air | air | air | air | — |
| blister | size 50 μm-1 mm | number | 7 | 8 | 6 | 7 | 28 |
|  | size 1 mm-2 mm | number | 2 | 3 | 2 | 3 | 9 |
|  | size 2 mm-3 mm | number | 0 | 0 | 0 | 0 | 2 |
|  | size 3 mm or more | number | 0 | 0 | 0 | 0 | 2 |
|  | total number/m² |  | 27 | 32 | 24 | 28 | 118 |
|  | average height | μm | 0.51 | 0.57 | 0.64 | 0.58 | 0.75 |
|  | average height × total number/m² |  | 13.87 | 18.23 | 15.45 | 16.47 | 88.61 |
| blister | height 1-2 μm | number | 18 | 14 | 12 | 13 | 67 |
|  |  | number/m² | 28.66 | 22.29 | 19.11 | 20.70 | 7.64 |
|  | height 2-3 μm | number | 10 | 10 | 5 | 5 | 21 |
|  |  | number/m² | 15.92 | 15.92 | 7.96 | 7.96 | 2.39 |
|  | height 3 μm or more | number | 2 | 2 | 1 | 0 | 6 |
|  |  | number/m² | 3.18 | 3.18 | 1.59 | 0.00 | 0.68 |
| light-emitting quality of organic EL device | visual evaluation |  | good | good | good | good | bad |

TABLE 4

|  |  |  | laminate | | | | |
|---|---|---|---|---|---|---|---|
|  |  |  | Comparative Example 2 L1 c | Comparative Example 3 L3 | Comparative Example 4 L5 | Comparative Example 5 L7 | Comparative Example 6 L1a |
| film |  |  | [P F 1 c] | [P F 3] | [P F 5] | [P F 7] | [P F 1 a] |
| washed with water pretreated with ozone |  |  | done | done | done | done | not done |
| plasma treatment |  |  | not done | done | not done | done | done |
| substrate | kind |  | G2 | G2 | G2 | G2 | G1 |
|  | area | m² | 0.3456 | 0.3456 | 0.3456 | 0.3456 | 0.1656 |
| heat treatment | temperature | ° C. | — | — | — | — | 450 |
|  | time | minute | — | — | — | — | 30 |
|  | environment |  | — | — | — | — | inert |
| cooling | rate | ° C./min. | — | — | — | — | 20° C./min. |
|  | environment |  | — | — | — | — | air |
| blister | size 50 μm-1 mm | number | 34 | 120 | 80 | 76 | 8 |
|  | size 1 mm-2 mm | number | 17 | 34 | 21 | 16 | 4 |
|  | size 2 mm-3 mm | number | 5 | 4 | 6 | 7 | 2 |
|  | size 3 mm or more | number | 4 | 0 | 3 | 1 | 4 |
|  | total number/m² |  | 171 | 457 | 318 | 288 | 109 |
|  | average height | μm | 0.95 | 0.57 | 0.68 | 0.63 | 1.40 |
|  | average height × total number/m² |  | 163.52 | 259.84 | 215.50 | 182.72 | 152.17 |
| blister | height 1-2 μm | number | 97 | 52 | 138 | 81 | 13 |
|  |  | number/m² | 5.82 | 1.53 | 6.66 | 5.18 | 34.20 |
|  | height 2-3 μm | number | 35 | 24 | 39 | 28 | 8 |
|  |  | number/m² | 2.10 | 0.71 | 1.88 | 1.79 | 19.50 |
|  | height 3 μm or more | number | 9 | 7 | 11 | 13 | 3 |
|  |  | number/m² | 0.54 | 0.21 | 0.53 | 0.8 | 4.90 |
| light-emitting quality of organic EL device | visual evaluation |  | bad | bad | bad | bad | bad |

Application Example

The polyimide/inorganic substrate laminates obtained in Examples 1 to 9 and Comparative Examples 1 to 6 were each dried at 100° C. for 1 hour and then set in a vacuum device for forming a gas barrier layer, followed by depressurization. After it was confirmed that a predetermined degree of vacuum was reached, a silicon nitride thin film was formed as a gas barrier layer on the surface of the polyimide film. Next, on the surface of the gas barrier layer of the laminate, each thin film was vapor-deposited at a vacuum degree of $10^{-5}$ Pa order and laminated. First, at a deposition temperature of 400° C., an anode made of an indium.tin oxide (ITO) having a thickness of 100 nm was formed. Subsequently, N,N'-di(1-naphthyl)-N,N'-diphenylbenzidine was formed on ITO to a thickness of 30 nm, and then 1,3-bis(N-carbazolyl)benzene was formed thereon to a thickness of 10 nm. Next, the following Compound 1 and 4,4'-bis(N-carbazolyl)-1,1'-biphenyl were vapor-codeposited from different deposition sources, and a 20-nm-thick layer was formed as a light-emitting layer. At this time, the concentration of Compound 1 was 10 wt %. Next, 1,3,5-tris(1-phenyl-1H-benzimidazole-2-yl)benzene was formed to a thickness of 40 nm, and lithium fluoride was vacuum-deposited thereon to 0.8 nm. Furthermore, ITO was formed in the same manner to form a cathode. A gas barrier layer was further formed thereon. Finally, they were separated from the glass plate to produce a flexible organic EL device.

With respect to the obtained organic EL device, the quality of the light-emitting element was visually evaluated. In terms of a 10×10 cm square, in the case where the number of black points (non-light-emitting point) was 1 or less, it is evaluated as "excellent", it is evaluated as "good" in the case of 3 or less, and it is evaluated as "bad" in the case of 4 or more. The results are shown in Table 2, Table 3, and Table 4.

As is clear from the results, it was shown that use of the polyimide/inorganic substrate laminate of the present invention allows for the manufacturing of an excellent device.

[Chemical formula 1]

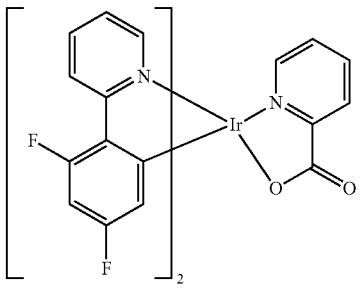

INDUSTRIAL APPLICABILITY

As shown above, the laminate of the present invention can be suitably utilized as a substrate for manufacturing a flexible electronic device, such as a flexible display element. The present invention is widely applicable to various flexible electronic devices, such as MEMS elements, sensor elements, solar cells, and wearable elements.

DESCRIPTION OF REFERENCE SIGNS

1: Inorganic substrate
2: Polyimide film
3: Foreign bodies (carbide particles)
h: Blister height (convex defect height)
w: Blister size (blister diameter)

The invention claimed is:

1. A laminate comprising a polyimide film and an inorganic substrate, characterized in that the laminate satisfies conditions (a) and (b):
(a) a number density of blisters is 6/m² or more and 50/m² or less, an average height of blisters is 2 μm or less, and a product of the number density of blisters (blisters/m²) and the average height of blisters (μm) is 20 or less; and
(b) a number density of blisters having a height of 3 μm or more is 10/m² or less,
wherein the blisters are formed by foreign bodies present between the polyimide film and the inorganic substrate and the foreign bodies contained inside the blisters are carbide particles.

2. The laminate comprising a polyimide film and an inorganic substrate according to claim 1, wherein the laminate has an area of 0.157 m² or more.

3. The laminate comprising a polyimide film and an inorganic substrate according to claim 2, further comprising a silane coupling agent condensate layer having a thickness of 5 nm to 500 nm between the polyimide film and the inorganic substrate.

4. The laminate comprising a polyimide film and an inorganic substrate according to claim 1, further comprising a silane coupling agent condensate layer having a thickness of 5 nm to 500 nm between the polyimide film and the inorganic substrate.

5. The laminate comprising a polyimide film and an inorganic substrate according to claim 1, wherein the laminate is obtained by imidizing a polyimide precursor to convert the polyimide precursor into the polyimide film and then laminating the polyimide film and the inorganic substrate.

6. The laminate comprising a polyimide film and an inorganic substrate according to claim 1, wherein the blisters comprise voids between the polyimide film and the inorganic substrate, which are caused by swelling of the polyimide film.

7. A method for producing the laminate comprising a polyimide film and an inorganic substrate according to claim 1, the method comprising the steps in the sequence set forth:
laminating a polyimide film and an inorganic substrate;
subjecting the resulting laminate to a heat treatment at a temperature of 350° C. or more and less than 600° C.

8. The method for producing the laminate comprising a polyimide film and an inorganic substrate according to claim 7, further comprising, after the heat treatment, cooling the laminate at a rate of 10° C./min or more and 90° C./min or less to at least 200° C.

9. The method for producing the laminate comprising a polyimide film and an inorganic substrate according to claim 8, further comprising, as a pre-process before laminating a polyimide film and an inorganic substrate, washing the polyimide film with ultrapure water pretreated with ozone.

10. The method for producing the laminate comprising a polyimide film and an inorganic substrate according to claim 7, further comprising, as a pre-process before laminating a polyimide film and an inorganic substrate, washing the polyimide film with ultrapure water pretreated with ozone.

* * * * *